United States Patent [19]

Feit et al.

[11] 4,136,225
[45] Jan. 23, 1979

[54] COVER COATINGS FOR PRINTED CIRCUITS

[75] Inventors: Eugene D. Feit, Berkeley Heights; Marguerite E. Wurtz, Murray Hill, both of N.J.

[73] Assignee: Bell Telephone Laboratories, Incorporated, Murray Hill, N.J.

[21] Appl. No.: 813,889

[22] Filed: Jul. 8, 1977

[51] Int. Cl.² .......................... B32B 7/14; B05D 5/12
[52] U.S. Cl. ...................................... 428/201; 427/63; 427/96; 427/102; 427/118; 428/901
[58] Field of Search ................. 428/201, 901; 427/63, 427/96, 118, 102

[56] References Cited

U.S. PATENT DOCUMENTS

| | | | |
|---|---|---|---|
| 3,090,706 | 5/1963 | Cado | 428/201 |
| 3,330,695 | 7/1967 | Curran | 428/201 X |
| 4,027,063 | 5/1977 | Fujiwara et al. | 428/901 X |
| 4,034,136 | 7/1977 | Wright et al. | 428/901 X |

*Primary Examiner*—Thomas J. Herbert, Jr.
*Attorney, Agent, or Firm*—Peter V. D. Wilde

[57] ABSTRACT

A flame retardant, flexible, solder resistant covercoat has been formulated based on dichloropropyl acrylate.

3 Claims, 1 Drawing Figure

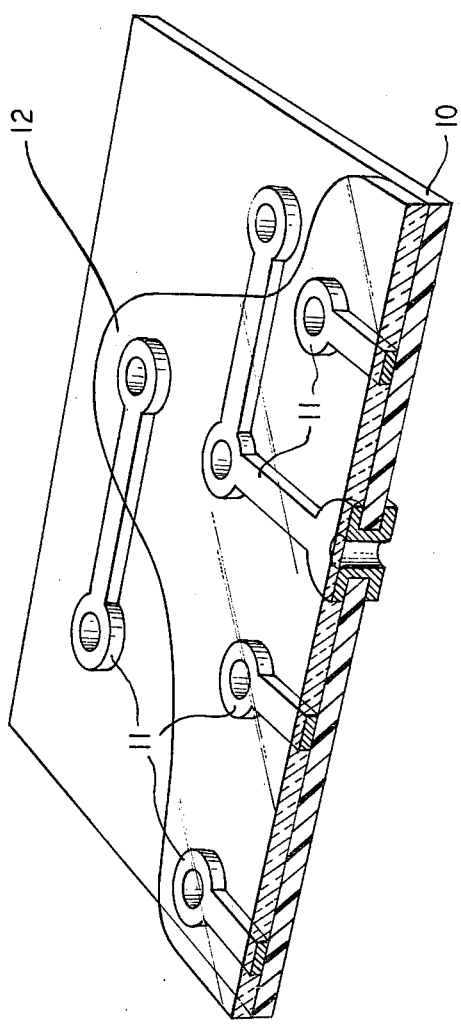

COVER COATINGS FOR PRINTED CIRCUITS

BACKGROUND OF THE INVENTION

Flame retardant covercoats for printed wiring should be solder resistant with good electrical resistance, and advantageously are also flexible to be adaptable to flexible printed circuits. For many applications it is useful for the coating to be photosensitive and thereby curable and/or patternable by U.V. radiation, preferably in an air atmosphere.

This invention is a coating material with these properties. It is based on dichloropropyl acrylate, selectively or non-selectively crosslinked to give a stable coating. The crosslinking agent may be any suitable material that produces a flexible polymer. The basic coating material, polymerized dichloropropyl acrylate (DCPA) is sufficiently flame retardant in itself that it is not essential that the crosslinking agent be non-burning. This allows considerable latitude in the selection. We have found that excellent coatings can be produced using a difunctional acrylate, and specifically neopentyl glycol diacrylate (NPGDA). A ratio of DCPA to NPGDA in the range of 2:1 to 6:1 will give useful coatings.

The FIGURE is a perspective view of a printed circuit with a protective covercoat of the kind described here. The FIGURE shows a thin flexible substrate 10 supporting a circuit pattern 11. Selected portions of the circuit pattern are covered with a protective covercoat 12.

To demonstrate the advantages of the DCPA coating material a test program was designed that compared the relevant covercoat qualities of DCPA with those of a currently used covercoat, designated GFR, and a covercoat made with 2,3-dibromomopropyl acrylate (DBPA), an experimental covercoat that was developed by us earlier, and on which we have developed a considerable amount of test data.

2,3-Dichloropropyl acrylate (DCPA) was synthesized by reacting acrylic acid with 2,3-dichloro-1-propanol in benzene. The reaction was catalyzed by $H_2SO_4$. The product was distilled through a 30cm Vigreaux column, b.p. 49-50 degrees C./0.2mm. This distillation was carried out twice and the distilled material was analyzed for purity by gas chromatography with the following result:

99.35 percent dichloropropyl acrylate (contains some 1,3-DCPA isomer)
0.06 percent alcohol
0.59 percent unknown 2,3-DCPA was polymerized in a 50:50 benzene:-chloroform solution at 40 degrees C. with azobisisobutyronitrile as the initiator. The resultant polymer had $\overline{M}_w = 5.23 \times 10^5$ and $\overline{M}_w/\overline{M}_n \leq 2.1$.

2,3-DBPA was polymerized at 103 degrees C. in an aqueous emulsion containing an anionic surfactant. The initiator was ammonium persulfate. Decanethiol (0.5 mole percent) was utilized as a chain transfer agent to prevent gelation. The $\overline{M}_w$ of this polymer was $5.7 \times 10^4$ and $\overline{M}_w/\overline{M}_n$ was 2.9. $\overline{M}_w$'s of P(DCPA) and P(DBPA) were sufficiently high that one would not expect their variation to be a dominant factor in thermal analysis behavior.

The glass transition temperature (Tg) of P(DCPA) is 6 degrees C. The Tg of P(DBPA) has been reported to be 18 degrees C. Both polymers are flexible, as they have Tg's below room temperature.

Thermogravimetric analyses (TGA) of the polymers were run in a nitrogen atmosphere and were programmed at a heating rate of 5 degrees C./min. from ambient to 490 degrees C. P(DCPA) exhibited a slow weight loss of less than 1 percent from 150 degrees C. to 300 degrees C. This loss can be attributed to residual monomer or solvent in the polymer. The actual degradation, the point at which rapid weight loss occurs, begins at 300 degrees C. Decomposition of P(DBPA) begins at 250 degrees C. The TGA's performed on these polymers give a semi-quantitative measure of the temperature required for decomposition of these polymers. The difference in bond dissociation energies results in a $\simeq$50 degrees C. difference in degradation temperature.

As a covercoat for printed wiring, it is often useful for the material to undergo photoinduced polymerization to yield a crosslinked film. In order to accomplish this photopolymerization of the monomer a difunctional acrylate, neopentyl glycol diacrylate (NPGDA) was used at a 4:1 ratio of DBPA or DCPA monomer to NPGDA. The photoinitiator consisted of 0.1 percent benzoin methyl ether and 1.0 percent Trigonal P-1 (1-t-butyl-4-(trichloroacetyl)benzene). This system achieves curing in an air atmosphere within 30 seconds when exposed through a variety of masks. The unexposed areas wash away cleanly when rinsed with methanol. No residue remained in the unexposed areas thus rendering the cured patterns compatible with subsequent soldering.

A thixotropic agent, Tullanox 500, hydrophobic, fumed silica, is used in the amount 2pph to achieve a convenient viscosity. Dythal, a dibasic lead phthalate, (10pph) and $PbCo_3$ (10pph) are used in the formulation to retard tarnishing of the copper on the substrate after the soldering operation. This formulation was developed for use with DBPA monomer and was used with DCPA monomer to permit direct comparison.

When a flame is held at the bottom of a sample of either P(DBPA) or P(DCPA) formulation crosslinked with NPGDA ($\simeq$0.015 in. thickness), only charring occurs. Neither coating will ignite.

Samples for electrical testing were prepared by coating test circuits with the above formulations and curing with U.V. light. The test circuits were washed with methanol and baked for 10 minutes at 120 degrees C. They were tested under three temperature/humidity stress conditions: (1) 35 degrees C./90 percent RH, (2) 50 degrees C./80 percent RH and (3) 100 degrees C./95 percent RH. The covercoat, GFR, underwent parallel testing.

The chlorinated and brominated samples were solder-dipped at 240 degrees C. for 10 seconds before testing at 50 degrees C./80 percent RH. The results for both DCPA and DBPA formulations under this test are shown in the following Table:

TABLE 1

| | Insulation Resistance at 50 Degrees C/80 Percent RH with Continuous 100V. Bias | |
|---|---|---|
| | Resistance($\Omega$) | |
| Time (days) | DBPA Formulation | DCPA Formulation |
| 1.3 | $1.4 \times 10^{10}$ | $2.0 \times 10^{10}$ |
| 30 | $1.7 \times 10^9$ | $2.8 \times 10^{10}$ |
| 79 | $3.9 \times 10^8$ | $2.9 \times 10^{10}$ |

These tests were carried out under a constant 100V bias. The soldered DBPA-formulated covercoats failed (under these conditions, failure is defined as an insulation resistance value of $<1 \times 10^8 \Omega$) after 87 to 109 days. After 79 days under test the soldered DCPA-formulated covercoats had an average value of $2.9 \times 10^{10}$ $\Omega$, which is slightly higher than the initial value at the onset of testing. GFR, like the DCPA formulation, is essentially unchanged after 80 days.

Samples were placed on electrical test at 35 degrees C./95 percent RH for 24 hours before being transferred to chambers maintained at 100 degrees C./95 percent RH. These samples were not solder-dipped before testing. During both of these tests, voltage was applied only when measurements were taken. 24-hour results for the 35 degrees C./90 percent RH conditions are shown in Table 2 for both DCPA and DBPA formulations. These conditions are too mild to show any difference between covercoats.

TABLE 2

| | Insulation Resistance at 35 Degrees C/90 Percent RH[7] | |
|---|---|---|
| TIME | SAMPLE | RESISTANCE($\Omega$) |
| 24 hours | DBPA Formulation | $3.6 \times 10^{11}$ |
| 24 hours | Uncoated Control | $4.0 \times 10^{11}$ |
| 24 hours | DCPA Formulation | $3.0 \times 10^{11}$ |
| 24 hours | Uncoated Control | $3.0 \times 10^{11}$ |

The results for tests carried out at 100 degrees C./95 percent RH are given in the following Table:

TABLE 3

| | Insulation Resistance at 100 degrees C/95 Percent RH[7] | |
|---|---|---|
| | Resistance ($\Omega$) | |
| TIME (hrs) | DBPA FORMULATION | GFR |
| 22 | $3.3 \times 10^7$ | $2.3 \times 10^7$ |
| 30 | $2.3 \times 10^7$ | |
| 66 | $1.1 \times 10^6$ | |
| 78 | $8.1 \times 10^5$ | |
| 90 | Out of range | $1.5 \times 10^7$ |
| TIME (hrs) | DCPA FORMULATION | GFR |
| 19 | $3.6 \times 10^7$ | $2.8 \times 10^7$ |
| 31 | $3.0 \times 10^7$ | — |
| 67 | $2.6 \times 10^7$ | — |
| 91 | $2.5 \times 10^7$ | $1.2 \times 10^7$ |
| 103 | $2.2 \times 10^7$ | — |
| 163 | — | $3.1 \times 10^6$ |
| 175 | — | $1.1 \times 10^6$ |
| 187 | $2.1 \times 10^7$ | $8.9 \times 10^5$ |
| 356 | $1.3 \times 10^7$ | — |

The values for the DBPA formulations dropped a full order of magnitude within 60 hours and failure (failure under these conditions is generally defined as a drop in values of an order of magnitude in less than 100 hours, followed by a further downward trend) occurred within 90 hours. Comparative values are given for circuits coated with GFR.

Values obtained for the DCPA formulation clearly indicate its superior electrical performance. Although both formulations had similar initial insulation resistance values, the DCPA formulation exhibited only a slight drop (less than a factor of 1.5) in the time that the DBPA formulation had failed.

Another noteworthy observation is that the covercoat, GFR, failed before the DCPA formulation. The DCPA formulation had dropped less than a factor of three after 356 hours, wherein the GFR abruptly dropped an order of magnitude after 163 hours.

After 356 hours, the DCPA-containing samples were removed from the test for inspection. No cracking or green coloration had developed. The brominated covercoat had cracked and corroded after testing at 100 degrees C./95 percent RH. GFR is color-coded with a green dye. Undyed samples under these conditions do not show green corrosion of the conductors. No cracking is observed in GFR.

It is evident that the DCPA formulation for a covercoat is superior to both the DBPA formulation and the GFR covercoat with respect to insulation resistance under accelerated aging conditions.

It is evident that the important ingredient in the compositions described above is the basic polymer comprising the covercoat material. Other ingredients such as the crosslinking agent, photoinitiator, thickening agent, tarnish inhibitor, are not critical in terms of composition and any suitable material can be used as desired. Of these materials, only the crosslinking agent and the photoinitiator are necessary in terms of function. The other ingredients are optional, as are additional additives and ingredients such as fillers, pigments etc.

Various additional modifications and extensions of this invention will become apparent to those skilled in the art. All such variations and deviations which basically rely on the teachings through which this invention has advanced the art are properly considered to be within the spirit and scope of this invention.

What is claimed is:

1. An electrical circuit comprising
   a flexible substrate
   a conductive pattern formed on the substrate and
   a protective coating covering portions of the conductive pattern
   the invention characterized in that the protective coating comprises a polymer of dichloropropyl acrylate crosslinked with an acrylic crosslinking agent in a weight ratio of 2:1 to 6:1 to yield a flexible coating.

2. The electrical circuit of claim 1 in which the coating contains a UV sensitizer for photocuring the film.

3. The electrical circuit of claim 1 in which the coating is patterned.

* * * * *